US011552605B2

(12) United States Patent
Alshuhail et al.

(10) Patent No.: US 11,552,605 B2
(45) Date of Patent: Jan. 10, 2023

(54) DIGITALLY CONTROLLED GROUND CAPACITOR MULTIPLIER

(71) Applicants: SAUDI ARABIAN OIL COMPANY, Dhahran (SA); KING FAHD UNIVERSITY OF PETROLEUM & MINERALS, Dhahran (SA)

(72) Inventors: Abdulrahman Alshuhail, Dhahran (SA); Hussain Alzaher, Dhahran (SA); Alaa El-Din Hussein, Dhahran (SA)

(73) Assignees: SAUDI ARABIAN OIL COMPANY, Dhahran (SA); KING FAHD UNIVERSITY OF PETROLEUM & MINERALS, Dhahran (SA)

( * ) Notice: Subject to any disclaimer, the term of this patent is extended or adjusted under 35 U.S.C. 154(b) by 124 days.

(21) Appl. No.: 17/193,612

(22) Filed: Mar. 5, 2021

(65) Prior Publication Data
US 2022/0239266 A1    Jul. 28, 2022

Related U.S. Application Data

(63) Continuation of application No. 17/158,808, filed on Jan. 26, 2021, now Pat. No. 11,309,854.

(51) Int. Cl.
*H03F 3/45*    (2006.01)
(52) U.S. Cl.
CPC ... *H03F 3/45269* (2013.01); *H03F 2200/129* (2013.01); *H03F 2203/45528* (2013.01)
(58) Field of Classification Search
CPC ..................................................... H03F 3/45
See application file for complete search history.

(56) References Cited

U.S. PATENT DOCUMENTS

| | | | |
|---|---|---|---|
| 3,831,117 A | 8/1974 | Fletcher et al. | |
| 3,911,296 A | 10/1975 | Davis | |
| 4,868,516 A | 9/1989 | Henderson et al. | |
| 5,726,599 A * | 3/1998 | Genest | H03H 11/405 327/552 |
| 6,778,004 B1 * | 8/2004 | Jackson | G05F 3/262 327/538 |
| 7,113,020 B2 | 9/2006 | Schoenbauer | |
| 7,436,240 B2 | 10/2008 | Kim et al. | |
| 7,466,175 B2 | 12/2008 | Smith et al. | |

(Continued)

OTHER PUBLICATIONS

Ahmed, M.T. et al., "Novel electronically tunable C-multipliers", Electronic Letters, vol. 31, No. 1, Jan. 1995, pp. 9-11 (3 pages).

(Continued)

*Primary Examiner* — Patricia T Nguyen
(74) *Attorney, Agent, or Firm* — Osha Bergman Watanabe & Burton LLP (57) ABSTRACT

A digitally controlled grounded capacitor multiplier includes: a single capacitor directly connected at one end to an input voltage and at another end to a negative input of an operational amplifier; the operational amplifier including a negative feedback loop; and a digitally controlled current amplifier (DCCA) connected to an output of the operational amplifier. The DCCA digitally controls the digitally controlled grounded capacitor multiplier. The digitally controlled grounded capacitor multiplier comprises only two active devices consisting of the operational amplifier and the DCCA.

20 Claims, 6 Drawing Sheets

(56) References Cited

U.S. PATENT DOCUMENTS

| | | | |
|---|---|---|---|
| 10,382,011 B2 | 8/2019 | Keskin | |
| 10,868,557 B2* | 12/2020 | Kinyua | H03M 1/0612 |
| 11,329,631 B1* | 5/2022 | Al-Absi | H03H 11/02 |
| 2007/0090872 A1 | 4/2007 | Chen et al. | |
| 2013/0257637 A1* | 10/2013 | Gotoh | H03F 3/04 |
| | | | 330/252 |
| 2018/0351536 A1 | 12/2018 | Keskin | |
| 2019/0095002 A1* | 3/2019 | Bohannon | H03K 17/9645 |

OTHER PUBLICATIONS

Al-Absi, MunirAhmad and Abdulaziz Ahmed Al-Khulaifi, "A New Floating and Tunable Capacitance Multiplier with Large Multiplication Factor", IEEE Access, vol. 7, Aug. 2019, pp. 120076-120081 (6 pages).

Al-Absi, Munir A. and Muhammad T. Abuelma'atti, "A Novel Tunable Grounded Positive and Negative Impedance Multiplier", IEEE Transactions on Circuits and Systems-II: Express Briefs, IEEE, vol. 66, No. 6, Jun. 2019, pp. 924-927 (4 pages).

Alpaslan, Halil, "DVCC-based floating capacitance multiplier design", Turkish Journal of Electrical Engineering & Computer Sciences, TÜBITAK, vol. 25, 2017, pp. 1334-1345 (12 pages).

Alzaher, Hussain A. et al., "A CMOS Highly Linear Channel-Select Filter for 3G Multistandard Integrated Wireless Receivers", IEEE Journal of Solid-State Circuits, IEEE, vol. 37, No. 1, Jan. 2002, pp. 27-37 (11 pages).

Dogan, Mehmet and Erkan Yuce, "A new CFOA based grounded capacitance multiplier", International Journal of Electronics and Communications (AEÜ), ScienceDirect, Elsevier GmbH, vol. 115, No. 153034, 2020, pp. 1-12 (13 pages).

Durham, Anna M. et al., "High-Linearity Continuous-Time Filer in 5-V VLSI CMOS", IEEE Journal of Solid-State Circuits, IEEE, vol. 27, No. 9, Sep. 1992, pp. 1270-1276 (7 pages).

Khan, I.A. and M.T. Ahmed, "OTA-Based Integrable Voltage/Current-Controlled Ideal C-Multiplier", Electronic Letters, vol. 22, No. 7, Mar. 1986, pp. 365-366 (2 pages).

López-Morillo, E. et al., "A Very Low-Power Class AB/AB Op-amp based Sigma-Delta Modulator for Biomedical Applications", 49th IEEE International Midwest Symposium on Circuits and Systems, IEEE, Aug. 2006, pp. 458-462 (5 pages).

Nahhas, Ahmed M., "Digitally Programmable Floating Impedance Converter using CMOS-DVCC", International Journal of Computer Applications, vol. 66, No. 17, Mar. 2013, pp. 9-13 (5 pages).

* cited by examiner

FIG. 7

DIGITALLY CONTROLLED GROUND CAPACITOR MULTIPLIER

CROSS-REFERENCE TO RELATED APPLICATIONS

This is a Continuation Application of U.S. patent application Ser. No. 17/158,808 filed Jan. 26, 2021.

FIELD OF THE DISCLOSURE

The present disclosure is directed to capacitance multiplier circuits and more particularly to digitally controlled grounded capacitance multiplier circuits.

BACKGROUND OF THE DISCLOSURE

Usually, integrated circuits (ICs) area constraints limit practical capacitors to a relatively low capacitance level. However, electronic circuits often require capacitors having a relatively higher capacitance level. A capacitance multiplier is an electronics circuit that increases the value of a reference capacitor by a certain multiplication factor, thus, achieving a higher equivalent capacitance level in an IC form. Capacitor multipliers are of particular importance for making integrated circuits possible that otherwise would be impractical with actual capacitors.

It is with respect to these and other considerations that the present disclosure is provided.

SUMMARY OF THE DISCLOSURE

According to an aspect of the present disclosure, there is provided a digitally controlled grounded capacitance multiplier circuit. The circuit comprises an input node and a first operational amplifier (op-amp) having at least a first input terminal, an output terminal, and a second input terminal that is grounded. The circuit also comprises a reference capacitor connected in series between the input node and the first input terminal of the first op-amp. Additionally, the circuit comprises a first resistor arranged in a feedback loop connecting the output of the first op-amp to the first input terminal and a second resistor arranged in series with the output of the first op-amp. The circuit further comprises a digitally controlled current amplifier (DCCA) having an analog input terminal for receiving an input current, an output terminal and a digital input terminal for receiving a digital control signal. In particular, the output terminal of the first op-amp is connected to the analog input terminal of the DCCA via at least the second resistor. Additionally, the output terminal of the DCCA is connected to the input node. Furthermore, the DCCA is configured to generate an output current by amplifying the input current as a function of the digital control signal.

According to another aspect of the present disclosure, there is provided an integrated circuit including a digitally controlled grounded capacitance multiplier circuit. The circuit comprises an input node and the digitally controlled grounded capacitance multiplier. More specifically, the digitally controlled grounded capacitance multiplier (CM) includes a first operational amplifier (op-amp) having at least a first input terminal, an output terminal, and a second input terminal that is grounded. The CM also includes a reference capacitor connected in series between the input node and the first input terminal of the first op-amp. Additionally, the CM includes a first resistor arranged in a feedback loop connecting the output of the first op-amp to the first input terminal and a second resistor arranged in series with the output of the first op-amp. The CM further includes a digitally controlled current amplifier (DCCA) having an analog input terminal for receiving an input current, an output terminal and a digital input terminal for receiving a digital control signal. In particular, the output terminal of the first op-amp is connected to the analog input terminal of the DCCA via at least the second resistor. Additionally, the output terminal of the DCCA is connected to the input node. Furthermore, the DCCA is configured to generate an output current by amplifying the input current as a function of the digital control signal.

These and other aspects, features, and advantages can be appreciated from the accompanying description of certain embodiments of the disclosure and the accompanying drawing figures and claims.

BRIEF DESCRIPTION OF THE DRAWINGS

The foregoing and other features of the arrangements of the present disclosure will be more readily apparent from the following detailed description and drawings of an illustrative embodiment of an invention encompassed by the disclosure.

DESCRIPTION OF CERTAIN EMBODIMENTS OF THE DISCLOSURE

A capacitance multiplier is an electronics circuit that increases the value of a reference capacitor by a certain multiplication factor. Capacitor multipliers are of particular importance for making low-frequency filter and long-duration timing circuits possible that otherwise would be impractical with actual capacitors. Usually, integrated circuits (ICs) area constraints limit practical capacitors to a relatively low capacitance level, e.g., a few tens of pF. Accordingly, to be effectively used in integrated filter design in particular, the capacitor multiplier should have both relatively large multiplication factor to achieve low pole frequency with reasonably small capacitor and programmability feature to tune the filter parameters. Tuning is needed in IC designs to compensate for inaccurate component values and temperature variations.

By way of overview and introduction, the present application describes a system and method for a digitally controlled grounded capacitance multiplier circuit (CM Circuit). Embodiments of the CM circuit can be used to convert various components from discrete components to ICs, including for example and without limitation, filters, time circuits, and phase locked loop (PLL). Embodiments of the CM circuit, which are predominantly integrated, and reduce the number of active components can beneficially reduce the overall size of the circuit, achieve performance requirements and can be cost effective, particularly when done at mass production. It is with respect to these and other considerations that the disclosure made herein is presented.

Embodiments of the digitally controlled grounded CM circuit adopts an op-amp, a digitally controlled current amplifier (DCCA) and two resistors in addition to a reference capacitor. The CM circuit is preferably designed using a standard complementary metal-oxide-semiconductor (CMOS) technology. The value of the equivalent capacitance can be adjusted through programming the gain of the current amplifier using a digital control input. According to a salient aspect, the CM circuit enjoys a large multiplication factor while using only two active devices. The large multiplication factors are achieved as a product of the resistor ratio and the gain of the DCCAs. For example, using a resistor ratio of 1000 and DCCA gain of 1000, a multiplication factor of $10^6$ can be obtained.

Figure 1:
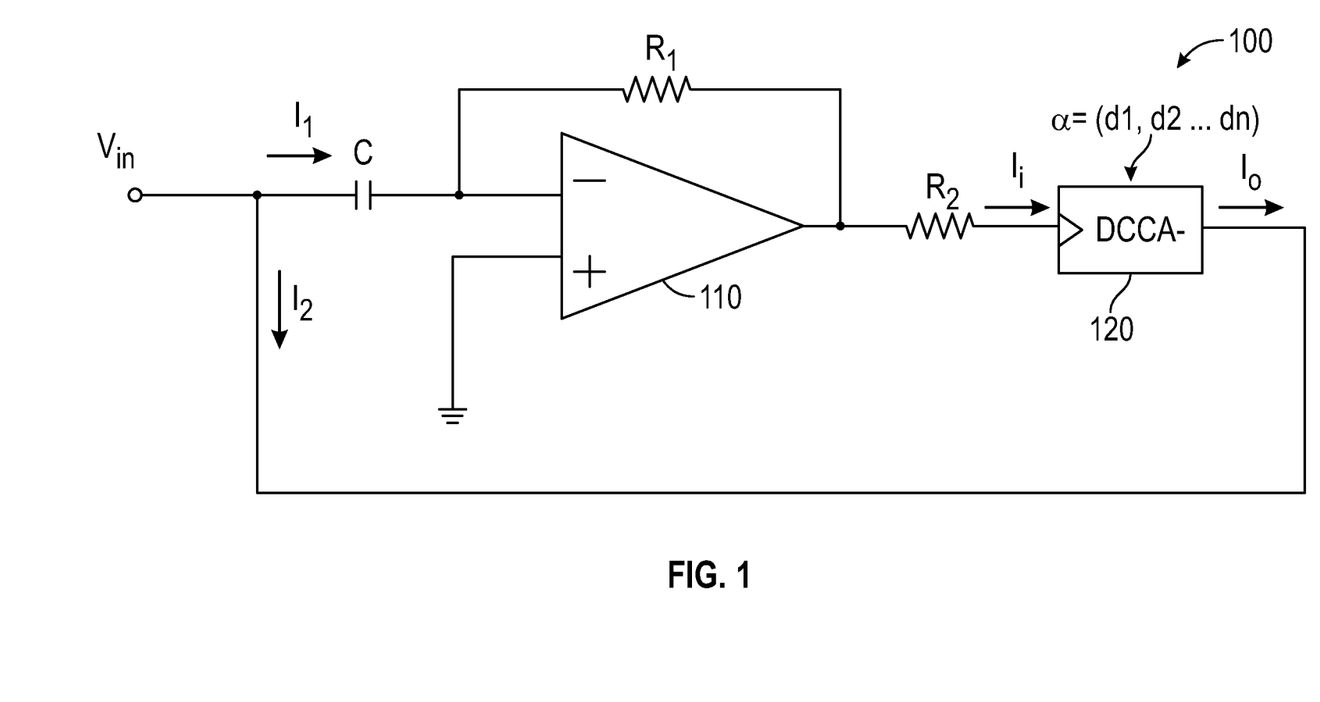
FIG. 1 is a high-level diagram illustrating an exemplary configuration of a digitally controlled grounded capacitance multiplier circuit according to an embodiment.

FIG. 1 is a schematic diagram showing a CM circuit 100 according to an embodiment. As shown, the CM Circuit comprises an op-amp 110, a digitally controlled current amplifier (DCCA) 120, two resistors R1 and R2 and a reference capacitor C.

More specifically, the CM circuit comprises an input node for receiving an input voltage Vin. Connected to the input node is the first side of the reference capacitor C. The opposite second side of the reference capacitor C is connected to a negative input terminal of the op-amp 110. The positive input terminal of the op-amp 110 is connected to ground. A negative feedback loop including resistor R1 connects the output terminal of op-amp 110 with the negative input terminal. The output of the op-amp 110 is connected to the analog input terminal of the DCCA 120 via resistor R2. The DCCA 120 also receives as an input a digital control input a comprising a number of digital bits (d1, d2 . . . dn). The output terminal of the DCCA is connected to the input lead The ideal terminal characteristics of the DCCA can be expressed as, DCCA input voltage, $V_i=0$ and $I_o=A*I_i$ where A is digitally controlled current gain. Therefore, it can be shown that the circuit of FIG. 1 exhibits an equivalent capacitor of:

$$C_{eq} = \frac{V_{in}}{I_{in}} = \frac{V_{in}}{I_1 + I_2} = C\left(1 + A*\frac{R_1}{R_2}\right) = K*C \quad (1)$$

There are two factors A and $R_1/R_2$ that can be used to achieve relatively large capacitance values. For example, with A=100 and $R_1/R_2$=100, a multiplication factor K of $10^4$ is achieved.

The CM circuit 100 comprises two active devices, namely, the op-amp 110 and the DCCA 120. The CM circuit 100 can thus be characterized as a mixed-signal integrated circuit, having both analog inputs (e.g., Vin) and digital inputs (e.g., the digital tuning input to the DCCA, not shown in FIG. 1) and associated analog and digital circuit elements.

In an embodiment, the CM circuit comprises only two active devices, namely, op-amp 110 and DCCA 120 and more preferably these two active devices are realized using CMOS technology.

Digitally programming the gain of the DCCA adjusts the equivalent capacitance of the CM circuit 100. Digital tuning is an attractive feature for modern mixed-signal integrated circuits (ICs). It allows operating circuits at different bandwidths and/or different gain settings. The digital tuning feature of the proposed circuit allows direct programmability by the digital signal processing (DSP) part of the system eliminating the use of auxiliary digital to analog converters from the DSP to control the analog part.

The particular configuration of the CM circuit 100 shown in FIG. 1 is provided as a non-limiting example and alternative circuit configurations and components can be used without departing from the scope of the present disclosure. It should also be understood that the circuit configuration, the type of components that are used and their electrical properties can be adjusted to suit the requirements of the intended application. For instance, the size of the resistor R1 or R2 or the reference capacitor C, all contribute to the capacitance multiplying characteristics of the CM circuit and can be tuned accordingly. Additionally, elements that are described as being connected or coupled can be directly or indirectly connected via one or more intervening components or circuits. It should also be understood that the CM circuit 100 is shown in FIG. 1 in a simplified form and can include additional components that facilitate the operation of the exemplary CM circuit.

There are several circuits usable to realize the active components of CM circuit 110, namely, the op-amp 110 and DCCA 120, in CMOS technology. Low power and high gain performance are considered the two preferred characteristics for selecting a suitable op-amp for use as op-amp 110 and also for selecting a suitable op-amp for use in the DCCA 120. Exemplary op-amp realizations suitable for use in op-amp 110 and/or the DCCA 120 in view of a relatively low voltage and low power operation while achieving high gain are further described herein. For example and without limitation, an exemplary, low power, low voltage, and high gain op-amp may have a power consumption on the order of a few miliwatts mWs and voltage supply of less than 1.8V while providing gain in the range of 100 dB.

In an embodiment, the op-amp 110 can be a single-ended op-amp. Preferably, op-amp 110 is configured to have a high gain of around 100 dB and a unity gain frequency of approximately 1 MHz.

Figure 2:
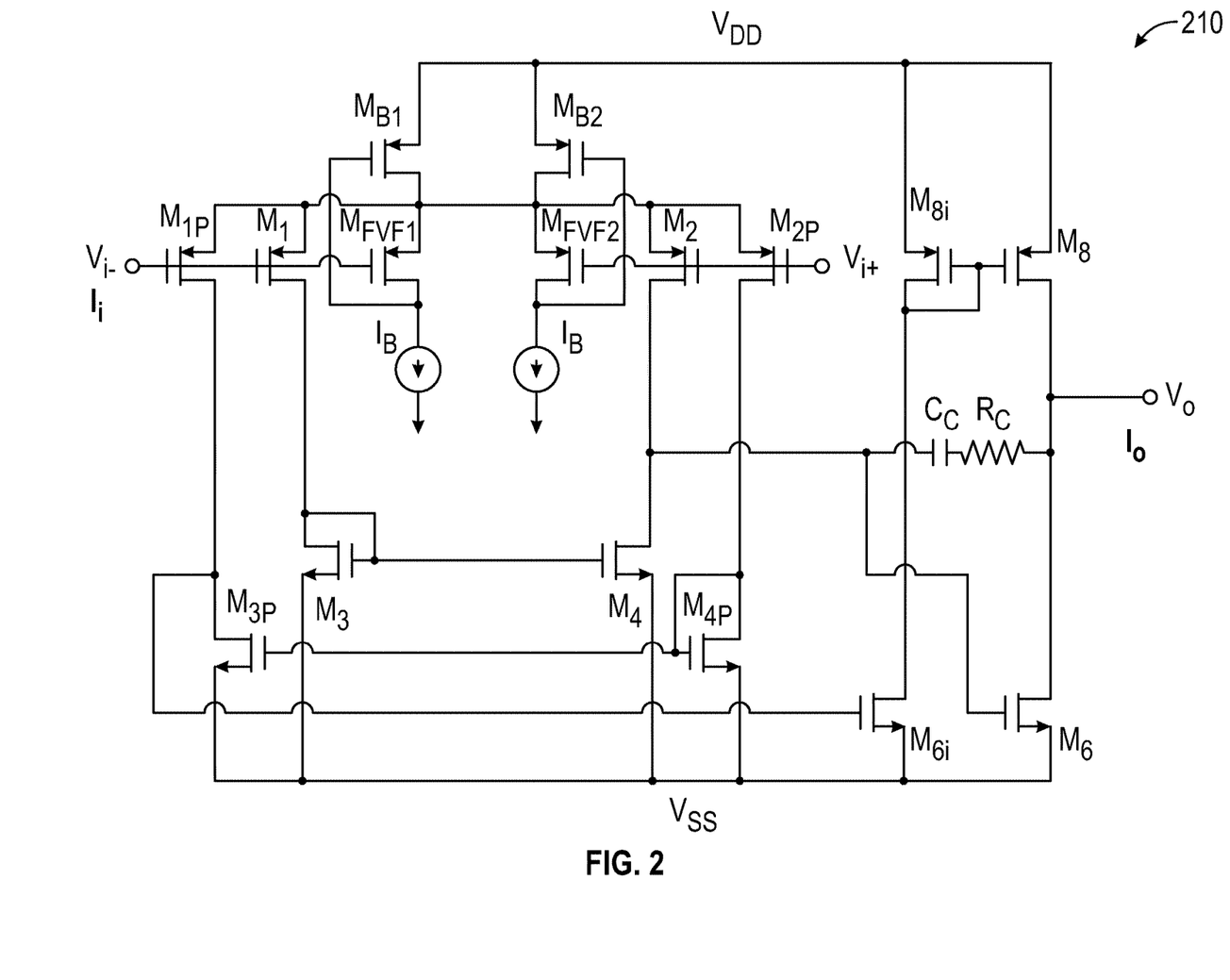
FIG. 2 is a circuit diagram depicting an exemplary configuration of an op-amp usable in the capacitance multiplier circuit of FIG. 1 according to an embodiment.

FIG. 2 is a circuit diagram depicting an exemplary configuration of an op-amp 210. In an embodiment, the Op amp 210 is a component of the DCCA 120 further described herein in connection with FIGS. 3-4. Additionally, Op-amp 210 can also be used to realize the op-amp 110 of the CM Circuit 100.

As shown in FIG. 2, op-amp 210 is a single-ended op-amp obtained from the circuit presented in E. López-Morillo, R. G. Carvajal, H. ElGimili, Antonio Lopez-Martin, Jaime Ramirez-Angulo, E. Rodríguez-Villegas, "A very low-power class AB/AB op-amp based sigma-delta modulator for biomedical applications," Midwest Symposium on Circuits and Systems (MWSCAS'06), vol. 2, pp. 458-462, 2006, the disclosure of which is incorporated by reference herein in its entirety. Op-amp 210 is selected because both of its input and output stages are using class-AB stages (as such, it is a two-stage, class AB/AB op-amp) and hence it can be optimized for relatively low power consumption. For example, this op-amp can provide gain in the order of 100 dB and unity gain frequency of 1 MHs while consuming less than 2 mW. It should be understood that op amp 210 is provided as a non-limiting example, and the CM circuit 100 is not constrained to the particular configuration of the op-amp 210 from the aforementioned paper. A two-stage CMOS op-amp is suitable as it can be used to achieve gain in the range of 100 dB and relatively low output resistance to derive resistive loads. In addition, the class-AB operation is desired for the op-amp used in the DCCA to provide large load currents, particularly at high gain settings.

Figure 3:
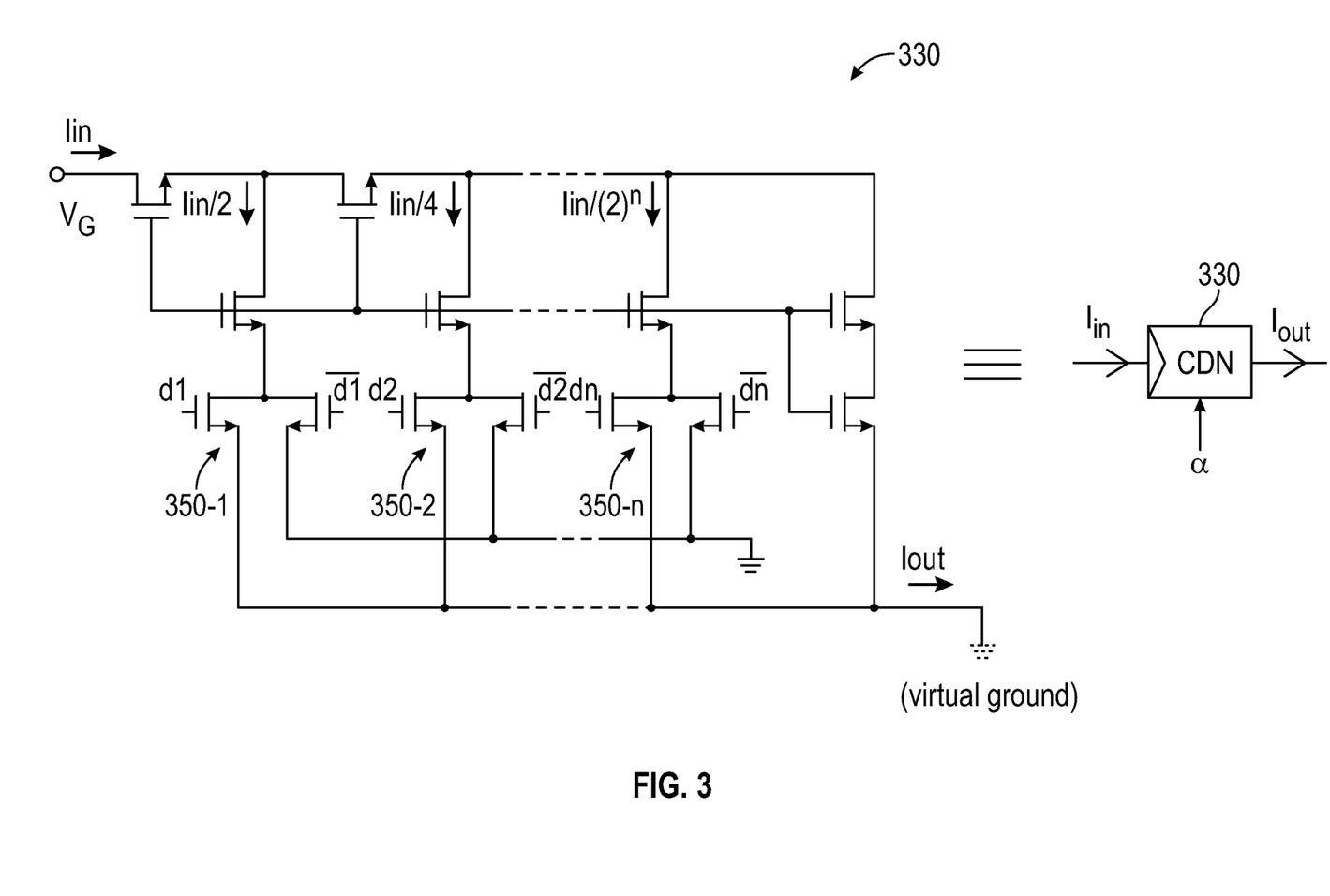
FIG. 3 is a circuit diagram depicting an exemplary configuration of a current division network usable in a digitally controlled current amplifier of the capacitance multiplier circuit of FIG. 1 according to an embodiment.

In an embodiment, the DCCA 120 comprises a current division network (CDN) configured to receive a digital input for programming the gain of the DCCA. FIG. 3 is a circuit diagram depicting an exemplary configuration of a CDN 330, which is useable in the DCCA 120, according to an embodiment. Shown to the left of FIG. 3 is the circuit diagram and shown to the right its simplified equivalent representation. In particular, the CDN 330 is used in Alzaher, H., Elwan, H. and Ismail, M., "A CMOS Highly Linear Channel Select Filter for 3G Multi-Standard Integrated Wireless Receivers," IEEE Journal of Solid-State Circuits, Vol. 37, 2002, pp. 27-37), the disclosure of which is incorporated by reference herein in its entirety. The CDN 330 is specifically used and configured to provide digital tuning of the gain of the DCCA 120.

The CDN 330's operation is similar to that of an R-2R ladder. The input current $I_{in}$ is binarily weighted through the different branches as a function of the respective values of the bits of the digital control word. With all transistors of the CDN selected of equal dimensions (W/L), the output current can be expressed as:

$$I_{out} = \sum_{i=1}^{n} \frac{d_i I_{in}}{2^i} \quad (2)$$

where $d_i$ is the ith digital bit and n is the size of a control word α, the digital control input to the DCCA/CDN. In this exemplary configuration, the size of CDN could be up to 10 bits without trimming. The number of branches corresponds to the number of bits in the control word. As shown, $d_1$ and $\overline{d1}$ are input to respective MOSFET transistors in a first branch 350-1, $d_2$ and $\overline{d2}$ are input to respective MOSFET transistors in a second branch 350-2 and dn and $\overline{dn}$ are input to respective MOSFET transistors in the n$^{th}$ branch 350-n of the CDN 330.

Figure 4:
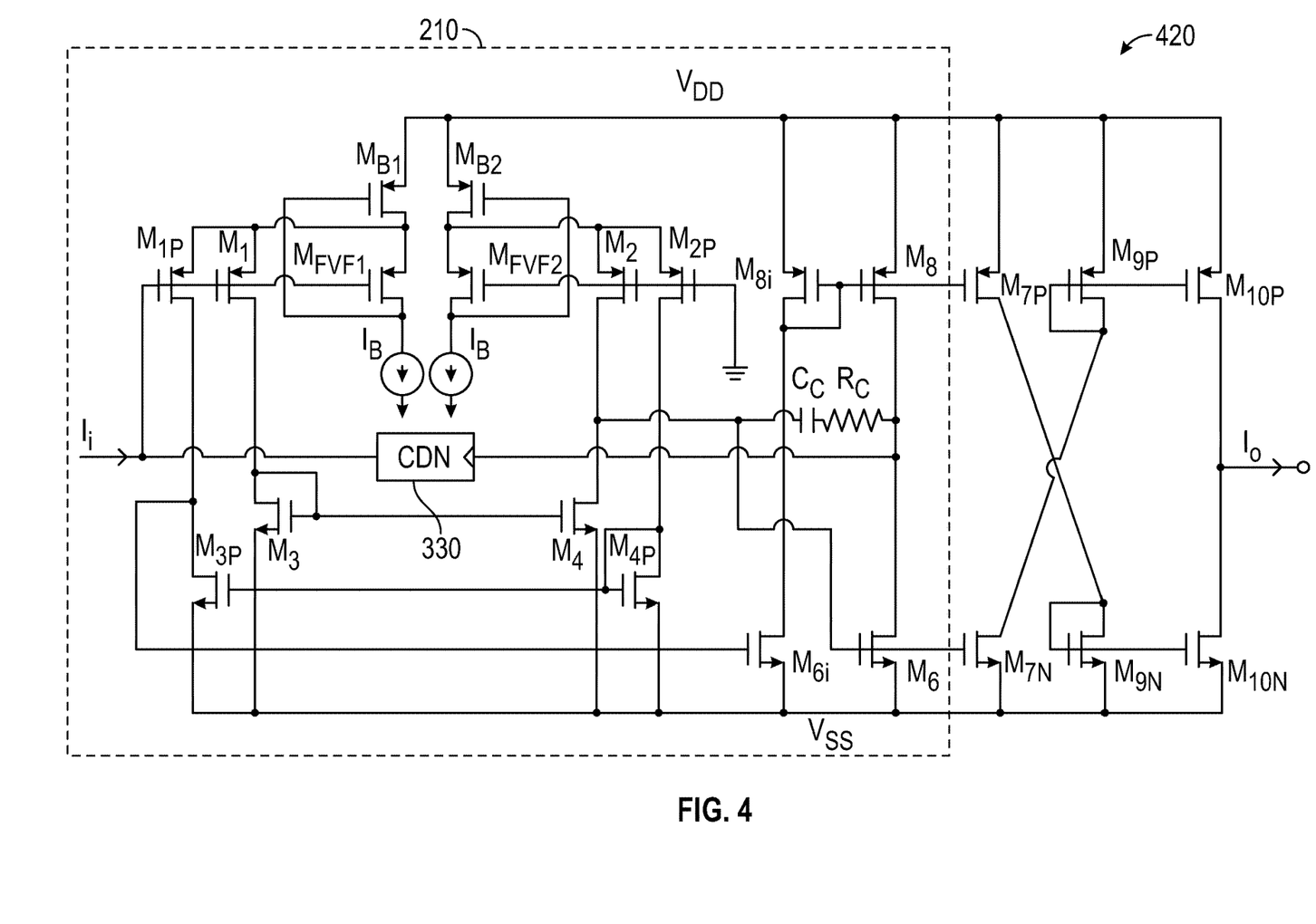
FIG. 4 is a circuit diagram depicting an exemplary configuration of the capacitance multiplier circuit of FIG. 1 according to an embodiment.

FIG. 4 is a circuit diagram illustrating an exemplary CMOS realization of a DCCA 420, which is useable as the DCCA 120 of CM Circuit 100, according to an embodiment. As shown, the op-amp 220 of FIG. 2, in combination with the CDN 330 of FIG. 3, are utilized to realize the DCCA 420. In particular, the CDN is provided in the feedback path between the output of the op-amp (the node corresponding to Vo shown in FIG. 2) and the input of the op-amp 220 (the node corresponding to Vo shown in FIG. 2). As a result, the input current to the CDN is adjusted as a function of the control word α and fed back to the input of the op-amp 220.

The operation of the DCCA can be explained as follows. Without the CDN (short circuit), negative feedback would adjust $V_{i-}$ to follow $V_{i+}$. Since $V_{i+}$ is grounded, then $V_{i-}$ is set at virtual ground and hence is used as an input current to terminal $I_i$. This current flows in M6 and M8 and is copied to the output terminal with $I_o = I_i$. That is, a unity gain current follower is obtained. With the CDN in the feedback path, negative feedback will adjust the input of the ($I_{in}$) of the CDN such that its output current ($I_{out}$) is equal to the input current ($I_i$.) This means the output current of the DCCA will be given by:

$$I_o = \frac{1}{\sum_{i=1}^{n} \frac{d_i}{2^i}} I_i = A * I_i \quad (3)$$

In an embodiment, as shown in FIG. 4, the DCCA 420 further comprises a cross-coupled current mirror stage comprising MOSFET transistors M7N, M7P, M9N, M9P, M10N, M10P, that is used to invert the output current and hence forming negative type DCCA. While the exemplary CM circuit 100 can comprise a negative type DCCA 420 to realize a positive capacitance multiplier, it should be understood that, in some embodiments, the CM circuit can also be reconfigured to realize a negative capacitance multiplier by incorporating a positive type DCCA. For example, in an embodiment, a positive type DCCA can be obtained by removing the cross-coupled current mirror stage M7P, M7N, M9P, and M9N. Subsequently, one should connect the gates of M10P and M10N to their counterparts of M8 and M6, respectively.

It should be understood that the CMOS realization of the DCCA shown in FIG. 4 comprising the op-amp 210 and current division network (CDN) 330 is a non-limiting example of a DCCA circuit according to an embodiment. The DCCA component 120 can similarly be realized using the exemplary CDN 330 in combination with any other suitable op-amp circuit. Different than other current division circuits, this particular CDN 330 has zero standby current and does not require a certain mode (triode or pinch off) of operation for its transistors. Other current division circuits can be used but they typically require basing their transistors to work either based on triode or pinch off. Also, CDN 330 is beneficial in that it is compact as it does not require scaling of the transistor sizes as often required by other current division circuits.

By way of further example, in some embodiments, the DCCA 120 can be realized using the CDN 330 and a current follower circuit. FIG. 4 is an exemplary circuit diagram of such a configuration. As shown in FIG. 4. Vi+ of the op-amp is grounded, and without the use of the CDN (replaced by a short circuit), negative unity feedback is established. This ensures virtual ground and low input resistance properties are attained. In this case, the negative feedback adjusts the op-amp's output to follow the input current Ii. The op-amp's output is copied by the current mirror stage and established as the output current of the circuit Io. Therefore, Io is equal to Ii, which is the function of a current follower.

In one exemplary application, the CM Circuit 100 can be used in integrated filter circuit designs, thus, preferably having a relatively large multiplication factor with a reasonably small practical capacitor C and a programmability feature to digitally tune the filter parameters.

Figure 5:
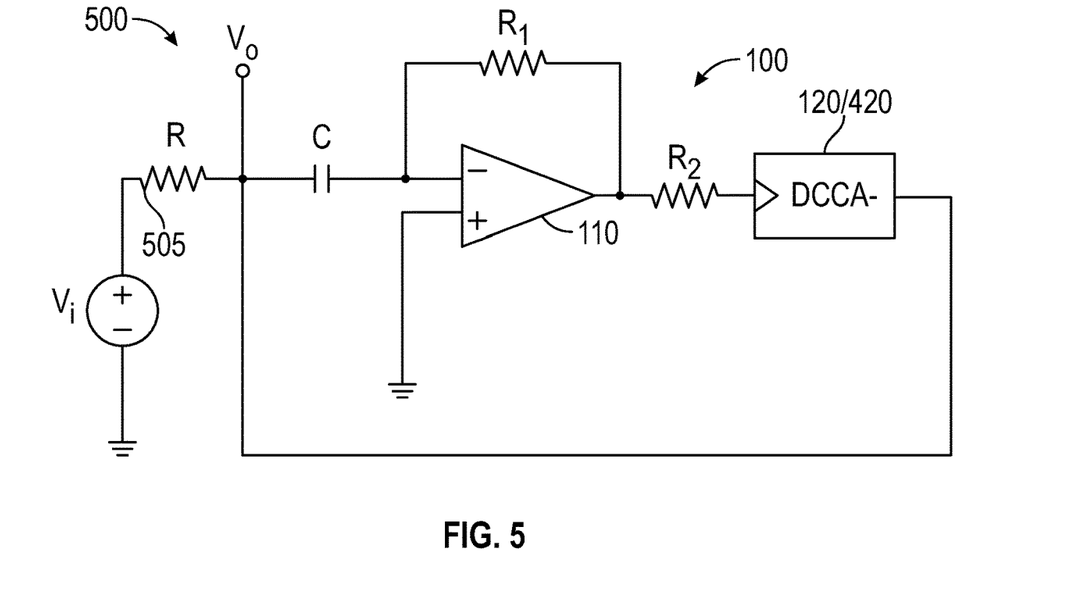
FIG. 5 is a circuit diagram depicting an exemplary lowpass filter circuit including the capacitance multiplier circuit of FIG. 1 according to an embodiment.

FIG. 5 illustrates a circuit diagram of a first-order lowpass filter 500 realized using the CM circuit 100 of FIG. 1 and the exemplary DCCA configurations further shown and described in connection with FIGS. 2-4. In particular, the exemplary filter circuit is a resistor-capacitor (R-C) filter comprising a resistor R 505 arranged in series with a capacitor and wherein an input voltage Vi is applied to the resistor and an output terminal Vo is provided between the resistor and capacitor. The capacitor component of the circuit 500 is effectively realized using the CM circuit 100. In this exemplary filter application, the pole frequency of the filter 500 can be tuned using the digitally programmed gain (A) of the DCCA. The pole frequency or the −3 dB frequency of this filter is given by:

$$f_o = \frac{1}{2\pi RC\left(1 + A * \frac{R_1}{R_2}\right)} \quad (4)$$

Figure 6:
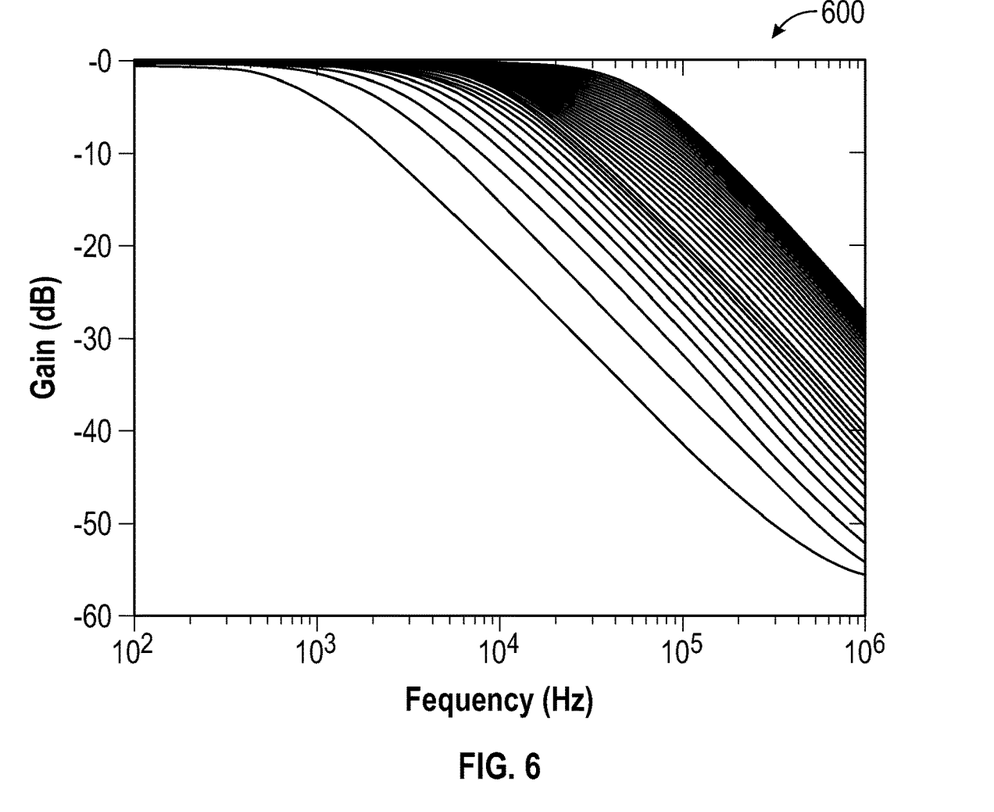
FIG. 6 is a graph illustrating the simulated magnitude responses of the lowpass filter of FIG. 5 with tuned pole frequency according to an embodiment.

FIG. 6 is a graph 600 of frequency (Hz) vs. gain (dB) illustrating the magnitude responses of the lowpass filter 500 as a function of tuned pole frequency during the simulation. More specifically, simulation results are shown for tuning the pole frequency of the filter from 62 kHz down to 900 Hz. The filter circuit 500 was simulated using a standard 90 nm CMOS process. During the simulation, supply voltages of ±0.75 V and $I_B$ of 10 uA were used. The values for the components were defined as follows: reference capacitor C=10 pF, $R_1$=200 kΩ, $R_2$=1 kΩ, and R=1 kΩ. Additionally, a 6-bit CDN was employed to adjust the equivalent capacitance value in response to a 6-bit digital control input.

In an exemplary physical realization of the CM circuit 100, the op-amp 110 can be implemented using a 741 op-amp IC, which are well known in the art. Additionally, two AD844 op-amp ICs, which are also well known in the art, can be used to realize the DCCA 120. As noted, the exemplary CM circuit design 100 needs only two active components, an op-amp and a DCCA, and in some implementations can be constructed using CMOS-based components. It should be understood however that the exemplary physical realization was constructed using a combination of off-the-shelf components. As a result, the exemplary implementation using off-the-shelf components utilizes three ICs. More specifically, there is no commercially available DCCA. Accordingly, an AD844 can be configured as a positive type current follower and two AD844s can be connected in cascade to realize a negative type current follower. Also, while the 741 op-amp and AD844 use BJT technology, these devices are nevertheless usable and are selected as the most popular off-the-shelf available devices. Such an exemplary configuration of the CM circuit 100 was also used to physically implement and test the first-order lowpass filter 500 shown in FIG. 5.

Figure 7:
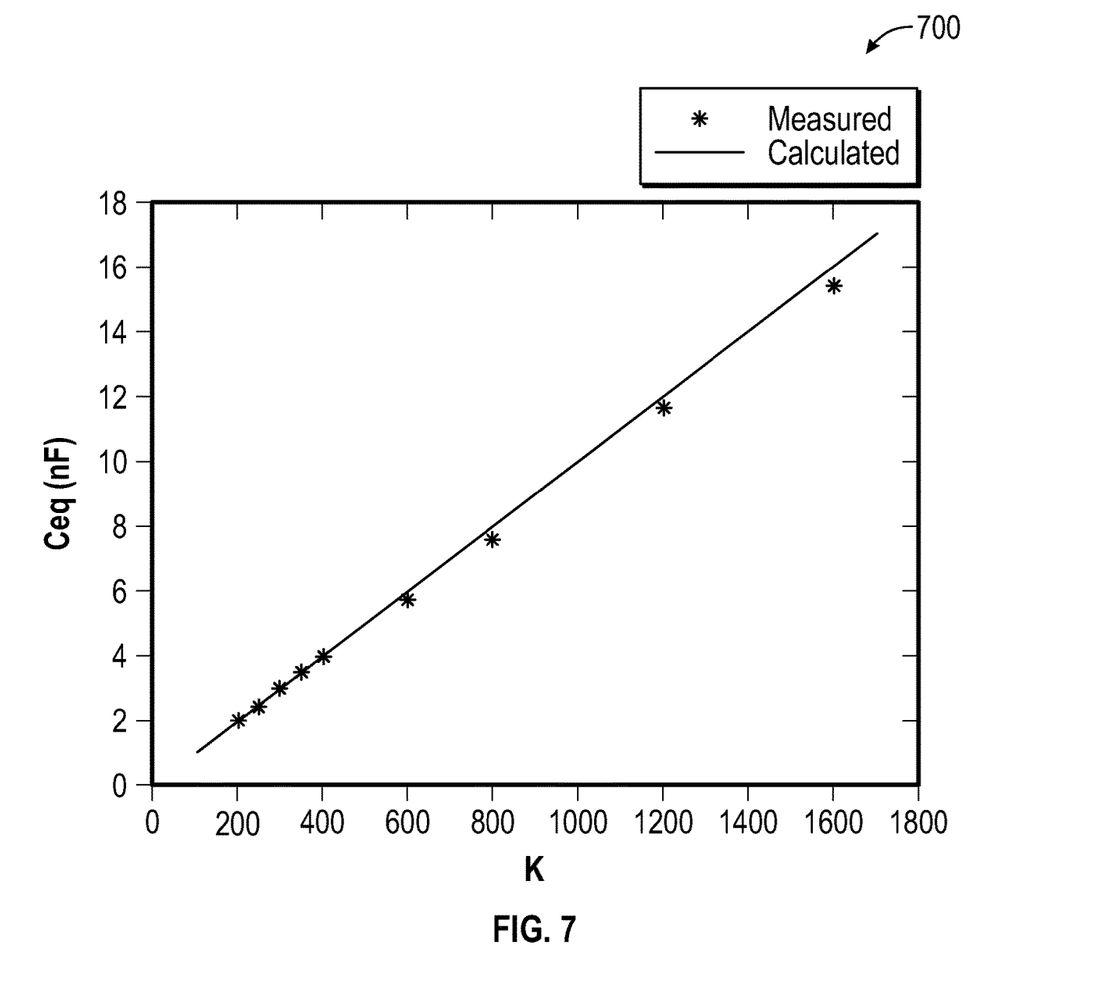
FIG. 7 is a graphical representation of actual/measured and calculated equivalent capacitances values for the capacitance multiplier circuit of FIG. 1 as incorporated into the lowpass filter circuit of FIG. 6 according to an embodiment.

FIG. 7 is a graphical representation 700 of measured and calculated values for the corresponding equivalent capacitances comparing the actual equivalent capacitance measured from the aforementioned physical implementation of the CM Circuit 100 in the filter circuit 500 and the theoretically calculated values. In this test, a reference capacitor of C=10 pF was used and the pole frequency of the filter was measured for several different capacitance multiplication factors. The corresponding equivalent capacitances of 2 nF up to 16 nF were recorded. It can be seen that the measured and calculated values are consistent. For clarity, the pole frequency of the filter can be tuned by varying the value of the passive resistors. In this example, tuning is performed by varying the passive resistor values rather than the gain of the DCCA as noted above. This is because the current amplifier built using the AD844 has a fixed unity current gain. Consequently, resistor R1 was varied to demonstrate the possibility of Ceq tuning. The pole frequency ($f_o$) is used to determine the equivalent capacitance of the circuit using:

$$C_{eq} = \frac{1}{2\pi f_o R} \quad (3)$$

It should be noted that in the exemplary filter 500 shown in FIG. 5, a high-pass filter function is obtained at the output of the op-Amp 110 and this is achieved using a grounded CM circuit 100. Usually, such a high-pass filter requires a floating CM circuit, but, according to a salient aspect of the disclosed embodiments is achievable using a grounded CM circuit.

It should be understood that the given filter application shown in FIG. 5 is just an example. The proposed CM circuit 100 can be used in many other applications. The CM circuit embodiments can similarly be used to realize various other electronics components effectively and in a smaller, more cost-efficient manner. For example, Analog Digitizer Units (ADUs) used in geophone systems are typically comprised of discrete components assembled in a printed circuit board, and hence they occupy a large area and are cost-inefficient. The embodiments of the CM circuit 100 can be used to convert many parts of an ADU from discrete components to ICs, including for example and without limitation, filters, time circuits, and phase-locked loop (PLL). Implementing a fully integrated Analog Digitizer Unit (ADU) in a single integrated circuit (IC) will reduce the size and improve the performance. Also, it will be cost-effective when done at mass production.

At this juncture, it should be noted that although much of the foregoing description has been directed to systems and methods for digitally controlled grounded capacitance multiplier circuits, the systems and methods disclosed herein can be similarly deployed and/or implemented in scenarios, situations, and settings far beyond the referenced scenarios. It is to be understood that like numerals in the drawings represent like elements through the several figures, and that not all components and/or steps described and illustrated with reference to the figures are required for all embodiments or arrangements.

Thus, illustrative embodiments and arrangements of the present systems and methods provide a system, processes and computer-implemented control methods, computer system, and computer program product for surface coating inspection. The flowchart and block diagrams in the figures illustrate the architecture, functionality, and operation of possible implementations of systems, methods and computer program products according to various embodiments and arrangements. In this regard, each block in a flowchart or block diagrams as it relates to a computer-implemented method can represent a module, segment, or portion of code, which comprises one or more executable instructions for implementing the specified logical function(s).

It should also be noted that, in some alternative implementations, the functions described herein or noted in a block diagram may occur out of the order noted. For example, two blocks or operations shown or described in succession may, in fact, be executed substantially concurrently, or may sometimes be executed in the reverse order, depending upon the functionality involved. It will also be noted that functional blocks or operations can, where applicable, be implemented by special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

The subject matter described above is provided by way of illustration only and should not be construed as limiting. Various modifications and changes can be made to the subject matter described herein without following the example embodiments and applications illustrated and described, and without departing from the true spirit and scope of the invention encompassed by the present disclosure, which is defined by the set of recitations in the following claims and by structures and functions or steps which are equivalent to these recitations.

What is claimed is:

1. A digitally controlled grounded capacitor multiplier comprising:
   a single capacitor directly connected at one end to an input voltage and at another end to a negative input of an operational amplifier;
   the operational amplifier comprising a negative feedback loop; and
   a digitally controlled current amplifier (DCCA) connected to an output of the operational amplifier, wherein the DCCA digitally controls the digitally controlled grounded capacitor multiplier, wherein
   the digitally controlled grounded capacitor multiplier comprises only two active devices consisting of the operational amplifier and the DCCA.

2. The digitally controlled grounded capacitor multiplier of claim 1, wherein the negative feedback loop of the operational amplifier comprises only a single resistor.

3. The digitally controlled grounded capacitor multiplier of claim 1, further comprising:
   a resistor connected between the operational amplifier and the DCCA.

4. The digitally controlled grounded capacitor multiplier of claim 3, wherein one end of the resistor is directly connected to the output of the operational amplifier and another end of the resistor is directly connected to an input of the DCCA.

5. The digitally controlled grounded capacitor multiplier of claim 1, wherein the DCCA is a negative-type DCCA.

6. The digitally controlled grounded capacitor multiplier of claim 1, wherein a capacitance value of the digitally controlled grounded capacitor multiplier is controlled by a gain of the DCCA.

7. The digitally controlled grounded capacitor multiplier of claim 1, wherein
   the negative feedback loop of the operational amplifier comprises only a single resistor,
   the digitally controlled grounded capacitor multiplier further comprises a resistor connected between the operational amplifier and the DCCA, and
   a capacitance value of the digitally controlled grounded capacitor multiplier is controlled by a ratio of R1/R2 where R1 is the single resistor in the negative feedback loop and R2 is the resistor connected between the operational amplifier and the DCCA.

8. The digitally controlled grounded capacitor multiplier of claim 7, wherein the capacitance value of the digitally controlled grounded capacitor multiplier is controlled by the ratio of R1/R2 and a gain of the DCCA.

9. The digitally controlled grounded capacitor multiplier of claim 1, wherein the DCCA comprises two-stage operational amplifier and a complementary metal oxide semiconductor based (CMOS-based) current division network (CDN).

10. The digitally controlled grounded capacitor multiplier of claim 9, wherein the CMOS-based CDN is connected in a feedback path of the two-stage operational amplifier.

11. A low pass filter comprising:
    a first resistor connected at a first end to an input source; and
    a digitally controlled grounded capacitor multiplier, wherein
    the digitally controlled grounded capacitor multiplier comprises:
    a single capacitor directly connected at one end to a second end of the resistor and at another end to a negative input of an operational amplifier;
    the operational amplifier comprising a negative feedback loop; and
    a digitally controlled current amplifier (DCCA) connected to an output of the operational amplifier, wherein the DCCA digitally controls the digitally controlled grounded capacitor multiplier, wherein
    the digitally controlled grounded capacitor multiplier comprises only two active devices consisting of the operational amplifier and the DCCA.

12. The low pass filter of claim 11, wherein the negative feedback loop of the operational amplifier comprises only a single feedback resistor.

13. The low pass filter of claim 11, further comprising:
    a second resistor connected between the operational amplifier and the DCCA.

14. The low pass filter of claim 13, wherein one end of the second resistor is directly connected to the output of the operational amplifier and another end of the second resistor is directly connected to an input of the DCCA.

15. The low pass filter of claim 11, wherein the DCCA is a negative-type DCCA.

16. The low pass filter of claim 11, wherein a capacitance value of the digitally controlled grounded capacitor multiplier is controlled by a gain of the DCCA.

17. The low pass filter of claim 11, wherein
    the negative feedback loop of the operational amplifier comprises only a single feedback resistor,
    the low pass filter further comprises a second resistor connected between the operational amplifier and the DCCA, and
    a capacitance value of the digitally controlled grounded capacitor multiplier is controlled by a ratio of R1/R2 where R1 is the single feedback resistor in the negative feedback loop and R2 is the second resistor connected between the operational amplifier and the DCCA.

18. The low pass filter of claim 17, wherein the capacitance value of the digitally controlled grounded capacitor multiplier is controlled by the ratio of R1/R2 and a gain of the DCCA.

19. The low pass filter of claim 11, wherein the DCCA comprises a two-stage operational amplifier and a complementary metal oxide semiconductor based (CMOS-based) current division network (CDN).

20. The low pass filter of claim 19, wherein the CMOS-based CDN is connected in a feedback path of the two-stage operational amplifier.

* * * * *